(12) United States Patent
Panajotov et al.

(10) Patent No.: US 6,785,317 B2
(45) Date of Patent: Aug. 31, 2004

(54) ENHANCED POLARIZATION CONTROL AND STABILIZATION BY MACROSCOPIC IN-PLANE ANISOTROPIC STRAIN IN VERTICAL-CAVITY SURFACE-EMITTING LASERS

(75) Inventors: Krassimir Panajotov, Brussels (BE); Hugo Thienpont, Halle (BE); Irina Veretennicoff, Overijse (BE)

(73) Assignee: Vrije Universiteit Brussels, Brussels (BE)

( * ) Notice: Subject to any disclaimer, the term of this patent is extended or adjusted under 35 U.S.C. 154(b) by 149 days.

(21) Appl. No.: 10/241,167

(22) Filed: Sep. 10, 2002

(65) Prior Publication Data

US 2003/0075725 A1 Apr. 24, 2003

Related U.S. Application Data

(60) Provisional application No. 60/318,530, filed on Sep. 10, 2001.

(51) Int. Cl.[7] ........................... H01S 3/083; H01S 3/082
(52) U.S. Cl. ........................................ 372/96; 372/106
(58) Field of Search ................................ 372/96, 106

(56) References Cited

U.S. PATENT DOCUMENTS 5,953,362 A * 9/1999 Pamulapati et al. .......... 372/96
6,188,711 B1 * 2/2001 Corzine et al. ............... 372/96

* cited by examiner

*Primary Examiner*—Don Wong
*Assistant Examiner*—Phillip Nguyen
(74) *Attorney, Agent, or Firm*—Barnes & Thornburg LLP

(57) ABSTRACT

The present invention relates to vertical-cavity surface-emitting lasers (VCSELs), and more particularly to a method and apparatus for controlling and stabilization of polarization in such devices. The method for stabilizing the polarization of light generated by a VCSEL assembly comprising a light generation region of a VCSEL, the VCSEL being mechanically coupled to a mounting substrate, comprises the steps of:

- mechanically coupling the mounting substrate to a second substrate which is coextensive or larger in area than the mounting substrate, and
- applying uniaxial strain to the light generation region of the VCSEL by means of external strain applied to the mounting substrate by the second substrate or by means attached to the second substrate.

18 Claims, 8 Drawing Sheets

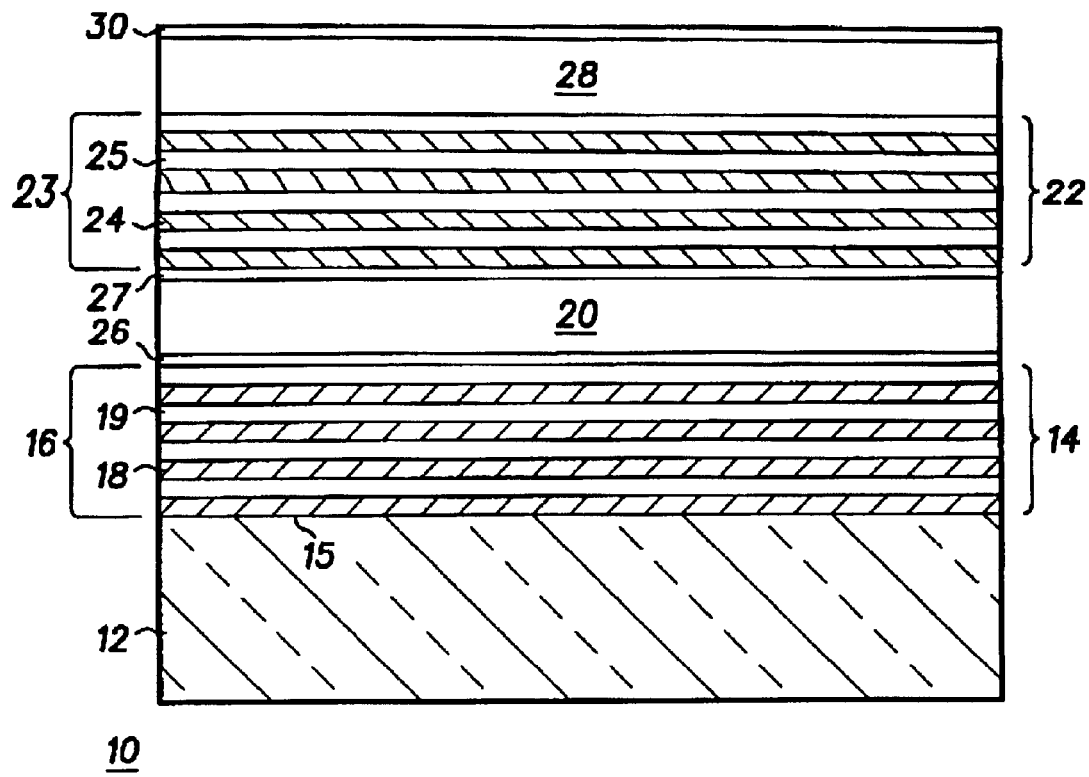
Fig. 1 - Prior art
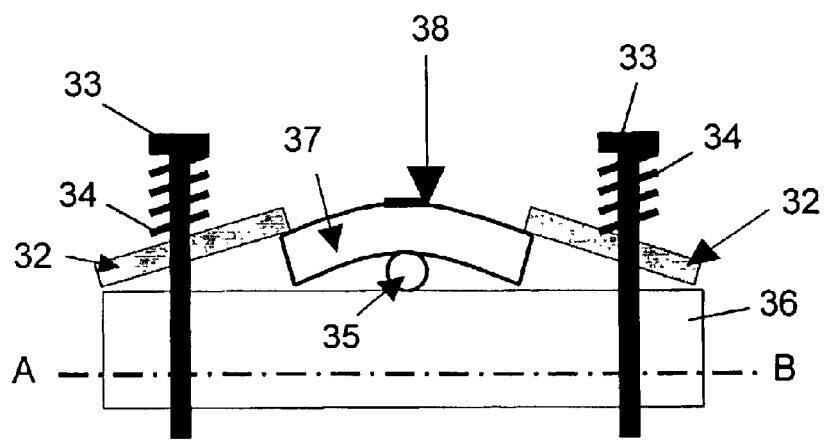
Fig. 2

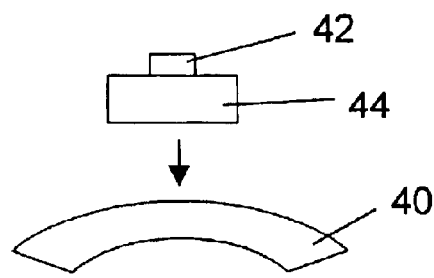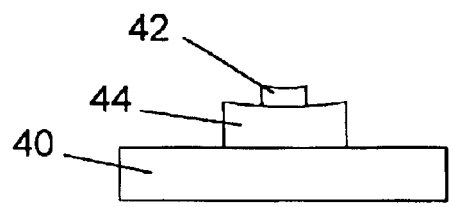
Fig. 3A                                    Fig. 3B
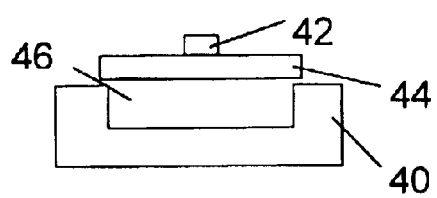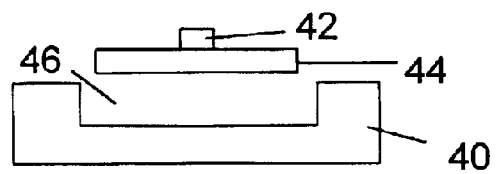
Fig. 4A
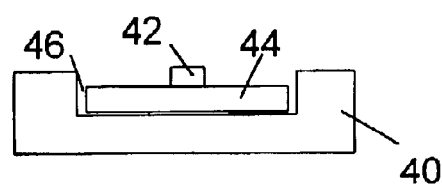
Fig. 4B
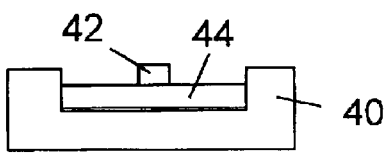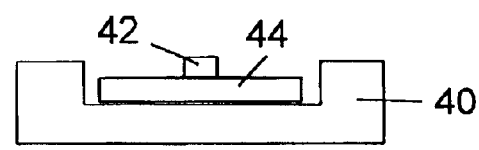
Fig. 4C

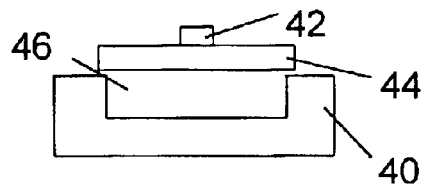
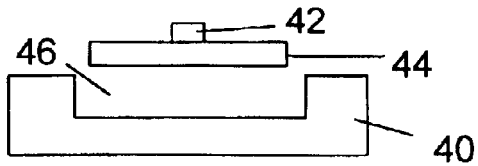
Fig. 5A
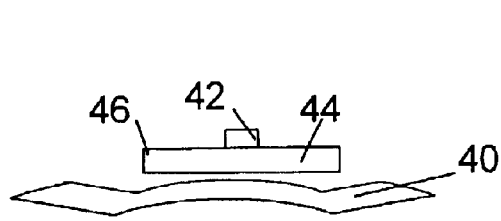
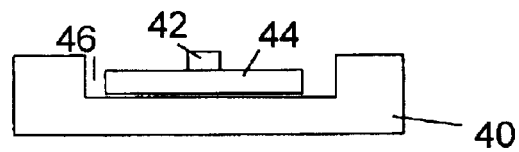
Fig. 5B
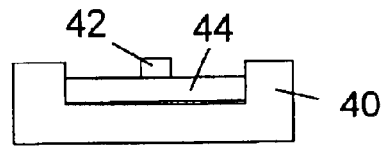
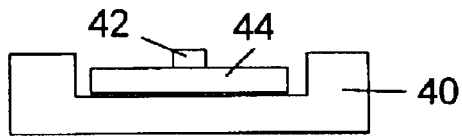
Fig. 5C
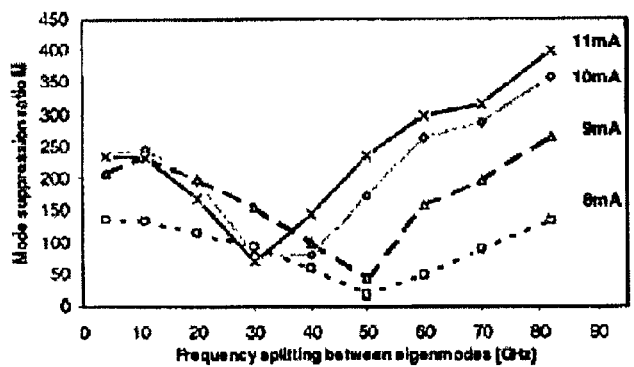
Fig. 8

ENHANCED POLARIZATION CONTROL AND STABILIZATION BY MACROSCOPIC IN-PLANE ANISOTROPIC STRAIN IN VERTICAL-CAVITY SURFACE-EMITTING LASERS

RELATED APPLICATION

This application is the non-provisional filing of provisional application No. 60/318,530, filed Sep. 10, 2001.

TECHNICAL FIELD OF THE INVENTION

The present invention relates to vertical-cavity surface-emitting lasers (VCSELs), and more particularly to a method and apparatus for controlling and stabilization of polarization in such devices.

BACKGROUND OF THE INVENTION

A typical structure of a conventional vertical-cavity surface-emitting laser (VCSEL) is illustrated in FIG. 1. Specifically illustrated is a simplified cross-sectional view of a portion of a VCSEL 10. VCSEL 10 is fabricated on a semiconductor substrate 12, more particularly e.g. a gallium arsenide substrate. A first mirror region, typically a stack of distributed Bragg reflectors 14, comprised of a plurality of alternating layers 16 is positioned on a surface 15 of semiconductor substrate 12. The plurality of alternating layers 16 of first stack of distributed Bragg reflectors may be formed of n-doped aluminum arsenide material and a n-doped gallium aluminum arsenide material. There is next fabricated a cladding region 26 on a surface of the first stack of distributed Bragg reflectors 14, an active region 20 disposed on cladding region 26, and a cladding region 27 disposed on a surface of active region 20. A second mirror region, typically a stack of distributed Bragg reflectors 22 is positioned on a surface of cladding region 27. The second stack of distributed Bragg reflectors 22 is formed of a plurality of alternating layers 23, more specifically, for example, alternating layers 24 and 25 of a p-doped aluminum arsenide and a p-doped gallium aluminum arsenide. The second stack of distributed Bragg reflectors 22 is followed by a one-half wavelength aluminum gallium arsenide contact layer 28. Contact layer 28 is p-doped to 1e19 $cm^{-3}$ or higher. Finally, a very thin gallium arsenide cap layer 30 is positioned on a surface of contact layer 28. Cap layer 30 is very thin, more specifically on the order of 100 Å thick. Cap layer 30 is p-doped to 1e19 $cm^{-3}$ or higher.

The active region 20 is typically constructed from one or more quantum wells of InGaAs, GaAs, AlGaAs, (Al)GaInP, GaInAsP or InAlAs, or is a bulk material active region.

It should be noted that VCSEL 10 is not shown to scale in FIG. 1. In particular the mirror regions and active regions have been expanded to provide clarity in the drawing. In practice, the thickness of the substrate 12 is typically 150 $\mu m$ compared to about 10 $\mu m$ for the mirror and active regions.

After processing of the VCSEL 10, it may be cleaved from the original substrate 12, and mechanically coupled to another substrate, called a mounting substrate. It may, however, also be kept on the original substrate 12, which is from then on also called (with regard to the present invention) a mounting substrate.

Because VCSELs are highly symmetric semiconductor lasers that emit light in a direction perpendicular to the plane of the quantum well(s), neither waveguiding nor gain anisotropy inherently exist. As a result VCSELs suffer from poor polarization stabilization. Switching between two modes of linear and orthogonal oriented polarization (PS—polarization switching) and mode hopping between these two states is often observed and leads to mode partition noise and to degradation of the optical systems based on VCSELs when polarization is important.

Different methods to force a preference to one of the two orthogonal linearly polarized states have been suggested. Most of them require a modification of the VCSEL structure by introduction of strains during the layer deposition/growth process or a complex additional processing of the VCSELs. The VCSEL performance could be degraded as a result.

EP-0924820 describes a VCSEL assembly in which the polarization is locked to a specified direction by externally introducing stress with a predetermined direction and magnitude. The VCSEL assembly includes a mounting substrate having top and bottom surfaces, the VCSEL being mechanically coupled to the top surface of the mounting substrate. This mounting substrate is selectively etched at the bottom side, whereby a groove or trench is formed which weakens the mounting substrate along a specific direction. A bonding agent such as solder with a different thermal expansion from that of the mounting substrate is used to bond the mounting substrate to another surface. When the solder joint is applied, the solder is molten at a temperature of typically 275° C. As the solder cools and solidifies, the solder joint shrinks thus applying force on the VCSEL assembly and forcing it to bend in a direction determined by the slot axis.

It is a disadvantage of the method device described in EP-0924820 that the polarization locking is based on different thermal coefficients of the bonding agent and the VCSEL assembly. This means that the locked device is inherently temperature dependent, and that the danger exists that the polarization of the emitted light changes with changing temperature. Furthermore, an additional etching step in the mounting substrate is needed. Additionally, the thermal treatment required to attach the solder may cause damage to the VCSEL assembly. Finally, it is difficult to form the slot or trench in third party devices so that chip packagers are dependent upon the original chip manufacturer to form the groove or trench.

It is an object of the present invention to provide an efficient and economic method for control and stabilization of the polarization state of the light emitted by any type of VCSEL as well as a VCSEL device which has a stabilized polarization state.

SUMMARY OF THE INVENTION

The present invention may provide a method for stabilizing the polarization of light generated by a VCSEL assembly comprising a light generation region of a VCSEL, the VCSEL being mechanically coupled to a mounting substrate. The method comprises the steps of: mechanically coupling the mounting substrate to a second substrate which is coextensive or larger in area than the mounting substrate, and applying uniaxial strain to the light generation region of the VCSEL by means of external strain applied to the mounting substrate by the second substrate.

The present invention may also provide a VCSEL device having a stabilized polarization of light generated by a VCSEL assembly comprising: a light generation region of a VCSEL, the VCSEL being mechanically coupled to a mounting substrate, a second substrate being coextensive or larger in area than the mounting substrate in at least one direction, the mounting substrate being mechanically coupled to the second substrate, and means for applying strain to the light generation region of the VCSEL by means of external strain applied to the mounting substrate by the second substrate.

The invention provides an economical way to apply uniaxial strain to a VCSEL which is stable over time and can be made independent of temperature changes, e.g. as caused by loading.

BRIEF DESCRIPTION OF THE DRAWINGS

FIG. 1 is a schematic cross-sectional view of a VCSEL according to the prior art.

FIG. 2 is a schematic illustration of a way to exert external forces to a packaged VCSEL in order to stabilize the polarization direction of the emitted light according to a first embodiment of the present invention.

FIG. 3A and FIG. 3B is a schematic illustration of a second embodiment of the present invention, in which a packaging substrate is flexed before fixing a VCSEL on a mounting substrate onto it.

FIG. 4A, FIG. 4B and FIG. 4C schematically illustrate how to apply compressive strain onto a mounting substrate by means of a hole in a packaging substrate, according to a third embodiment of the present invention.

FIG. 5A, FIG. 5B and FIG. 5C schematically illustrate schematically illustrate how to apply compressive strain onto a mounting substrate by means of a hole in a packaging substrate, according to a fourth embodiment of the present invention.

FIG. 8 illustrates the mode suppression ratio as a function of the frequency splitting between the two modes for different currents.

DESCRIPTION OF THE INVENTION AND PREFERRED EMBODIMENTS

Figure 6:
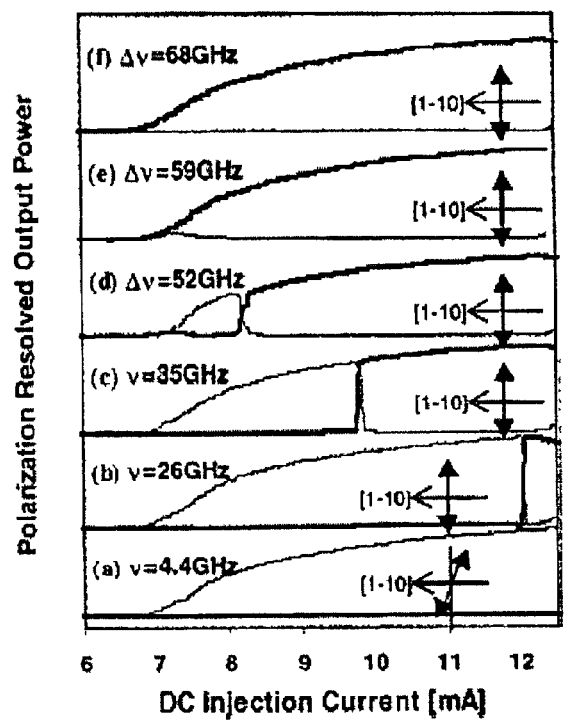
FIG. 6 is a graph of the polarization resolved optical output power in function of the dc injection current for increasing tensile strain along the [1–10] direction.

The present invention will be described with reference to certain embodiments and to certain drawings, but the invention is not limited thereto. These examples illustrate the invention only.

The present invention concerns a method for enhancing the polarization control and stabilization of VCSELs of general performance. Different types of VCSELs may for example show the following differences: gain or index guiding; proton-implanted, air-post or oxide confined; with single (multiple) quantum well or bulk material active region; with carrier injection through the Bragg mirrors or intracavity; with semiconductor or dielectric mirror(s) etc, all of which are included within the scope of the present invention.

A new way of introducing anisotropy is proposed which does not require any additional processing of the VCSELs. Instead, a macroscopic in-plane anisotropic strain is introduced in the VCSEL dies after they have already been completely grown and fully processed. This is done at the stage of packaging, just before packaging or even thereafter. The application of strain may be made at room temperature and can be independent of differences in thermal expansion of components, which makes the final device independent of temperature changes. Additional advantages of the present method are that the shape of the extracted beam is not modified, thus preserving the superior Gaussian beam quality, and also that the VCSELs characteristics are not modified, i.e. no additional losses are introduced in the VCSEL cavity nor is the gain decreased.

The present invention provides a method and means for applying stress on a packaging substrate or an intermediate substrate between the mounting substrate of the VCSEL and a packaging substrate, which stress introduces strain into the VCSEL.

Anisotropy introduced in such a way will lead to polarization stabilization for the higher order transverse modes. Due to the short cavity, VCSELs are single longitudinal mode devices, but depending on the diameter of the optical (current) confining aperture they usually support a number of transverse modes. Even for small diameter, such higher order modes appear with increasing the injection current due to spatial hole burning in the carrier distribution by the stimulated emission in the fundamental mode. Such spatial hole leads to better overlap of the carrier distribution with the optical field pattern of the higher order modes and increased modal gain for these modes. Usually, higher order modes start lasing in the orthogonal polarization to the lasing fundamental mode. The anisotropy introduced by the method according to the present invention will change such behavior: all modes of certain polarization direction will always posses higher gain to loss ratio and will be favored.

A first embodiment of the present invention is to apply external force or stress on a packaged VCSEL using an external mechanical device, such as a mechanical laser holder as shown in FIG. 2.

For example proton-implanted GaAs/AlGaAs quantum well (QW) VCSELs from VIXEL Corporation, operating around 850 nm may be used. An external stress is applied on the VCSEL using a mechanical laser holder as shown in FIG. 2. The stress is caused by pressing the upper metal plate 32 on the package of the VCSEL and can be controlled by turning two screws 33 supported by springs 34. A thin steel rod 35 is inserted between the holder 36 and the metal plate 37 of the package. An in-plane anisotropic strain can now be induced by bending the metal plate 37 of the laser package on which the VCSEL wafer 38 is glued. This geometry introduces a tensile strain in the laser along line A-B and a compressive strain in the orthogonal direction. All measurements presented hereinafter are conducted at a fixed substrate temperature of 25° C., for which so far only polarization switching (PS) from a lower to a higher frequency ($V_L \rightarrow V_H$ or type II PS, as described in B. Ryvkin et al., "Effect of photon-energy-dependent loss and gain mechanisms on polarisation switching in vertical-cavity surface-emitting lasers", Journ. Opt. Soc. Am. B, v.16, N.11, 1999) is observed for this VCSEL. Two situations are investigated where the longer side of the laser wafer, corresponding to the [1–10] direction, is either parallel or perpendicular to the direction of the tensile strain.

When the tensile strain is parallel to the [1–10] direction (case A), the laser emits in the low frequency mode ($V_L$ state) at a small external stress. The direction of this linearly polarized state is about 20° away from the [1–10] direction, as shown in FIG. 6(a). The higher frequency mode is shown by a thick solid line, and the lower frequency mode is shown by a thin solid line. The orientation of the higher frequency linearly polarized mode is shown schematically together with the [1–10] crystallographic direction. The direction of the in-plane tensile strain is horizontal. When continuously increasing the external stress, a rotation of the polarization direction is first observed, as shown in FIG. 6, followed by a stabilization along the [1–10] direction. PS in the fundamental mode first appears at rather large values of the strain induced frequency splitting (26 GHz in FIG. 6(b)) and for a quite high current (12 mA in FIG. 6(b)). As the external stress is further increased (frequency splittings ranging from 25 to 60 GHz), the PS current continuously decreases, as shown in FIG. 6(c) and FIG. 6(d). A very broad region of stress-induced type II PS tuning exists. For larger splittings, the laser is emitting in the higher frequency mode only ($V_H$ state), with its linear polarization oriented perpendicular to [1–10] (FIG. 6(e) and FIG. 6(f)).

Figure 7:
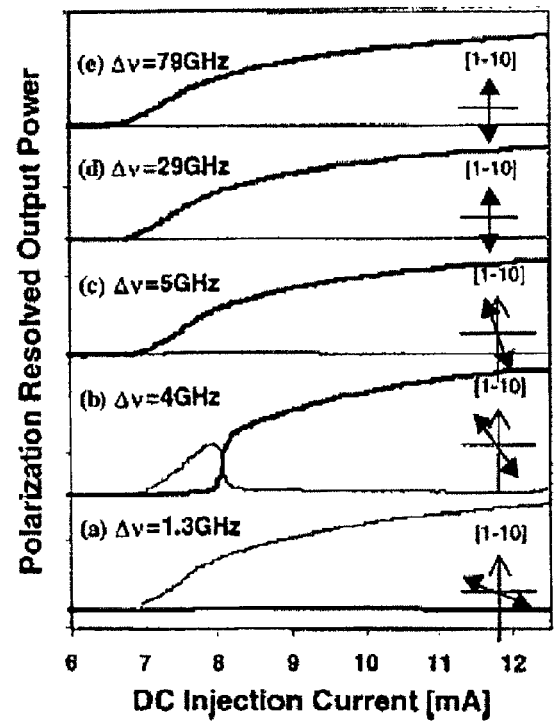
FIG. 7 is a graph of the polarization resolved optical output power in function of the dc injection current for increasing tensile strain along the [110] direction.

When the tensile strain is along the [110] direction (case B), for a small external stress the laser is emitting again in the low frequency mode ($V_L$ state) oriented about 15° away from the [1–10] direction, as shown in FIG. 7(a). Again the higher frequency mode is shown by a thick solid line, and the lower frequency mode is shown by a thin solid line. The orientation of the higher frequency linearly polarized mode is shown schematically together with the [1–10] crystallographic direction. The direction of the in-plane tensile strain is horizontal. Now, even a very small additional stress changes the direction of linear polarization much more than in case A. The tuning of the polarization orientation with increasing external stress is toward the [110] direction, as shown in FIG. 7(b). Before reaching this orientation type II PS is observed in the fundamental mode in a very restricted domain of external stress (frequency splitting between 4 and 4.5 GHz in FIGS. 7(b) and 7(c)). This is again type II PS but now the polarization eigenstates are oriented at about 40° degrees with respect to the [110] direction. Furthermore, it is much more difficult to stress-tune the PS current and it is impossible to judge for the direction of this tuning, or thus to determine how this current varies with stress. At a frequency splitting of about 4.5 GHz PS disappears and the laser is emitting in the higher frequency mode ($V_H$ state) only. Further increasing the external stress fixes the polarization eigenstates along the [110] and [1–10] directions, as shown in FIG. 7(d), and the higher frequency mode becomes more and more favorable. No PS is observed over the entire region of frequency splitting, whereas it did exist in case A.

The magnitude of the externally induced in-plane anisotropic strain can be estimated from the change of the polarization direction of the lasing mode. For the maximum frequency splitting of about 80 GHz in FIG. 7(e), a value of approximately $4*10^{-4}$ is obtained for its tensile component along [110] crystallographic direction.

In FIG. 8 the mode suppression ratio M is shown, defined here as the ratio of the power of the lasing and the nonlasing eigenmodes, or the primary polarization mode and the orthogonal mode, as a function of the frequency splitting between these two modes and this for different injection currents. As can be observed from FIG. 8, M does change with the splitting: initially it continuously decreases, reaches a minimum at the PS point and increases afterwards. As the current and the substrate temperature are fixed, this is a sign that the effective gain difference between the two modes has a minimum at the PS point.

It is to be noted that independently of the direction of the tensile strain, the threshold current continuously increases with the substrate temperature. This shows that the VCSEL is working at the higher frequency side of the gain maximum for the current scans presented in FIG. 6.

An explanation proposed by Choquette et al., Appl. Phys. Lett. 64, p. 2767, 1994 and Appl. Phys. Lett. 64, p. 2062, 1994, relies on the spectral shift of the gain maximum relative to the cavity resonances caused by current heating. The two linearly polarized modes have slightly different resonant frequencies due to an inherent birefringence in the cavity. Because the mode selection happens according to the higher material gain, the higher frequency state will be lasing on the lower frequency side of the gain curve and vice versa. In such a way, polarization switching from the higher frequency mode to the lower frequency mode ($V_H \rightarrow V_L$ or type I PS as described in B. Ryvkin et al., J. Opt. Soc. Am. B 16, p. 2106, 1999), is predicted. In this view the gain depends on the polarization state only via the modal frequency.

Figure 9:
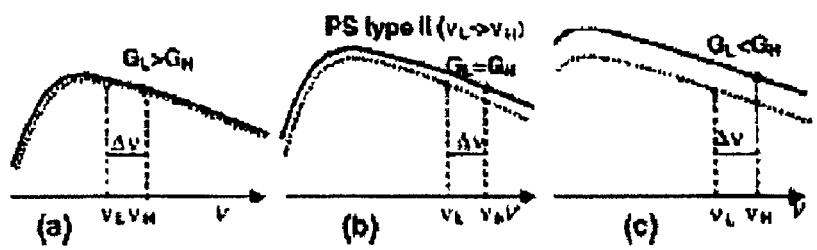
FIG. 9 is a scheme of the gain spectrum when a separate gain curve for each linearly polarized eigenstate is considered.

The present experiments demonstrate that in-plane anisotropic strain, either unintentionally or externally induced, introduces both birefringence and gain anisotropy. Indeed, not only birefringence is important, since completely different polarization behavior is observed for identical frequency splittings but for two orthogonal directions of the tensile strain. In the present case, an in-plane gain anisotropy exists, i.e., the gain is different for different polarizations in the plane of the QW. In addition, there is a gain difference due to the frequency splitting. It is assumed that for tensile strain along [110] and [1–10] directions, the gain anisotropy has the same principal axes as the index ellipsoid, namely [110] and [1–10]. Due to the strain-induced gain anisotropy, each linearly polarized state has its own gain curve, schematically depicted in FIG. 9, on which it moves as any relevant parameter, e.g., lattice and carrier temperature, carrier density, etc., is changed. In addition to the strain-induced gain anisotropy, the gain difference due to the frequency splitting between the linearly polarized cavity modes that is also a result of the strain via the elasto-optic effect induced birefringence has to be considered. It can be seen in FIG. 9 that type II PS occurs on the higher frequency side of the gain maxima as the current is increased from (a) to (c).

As the dc current is increased, the active region heats up and the gain undergoes a redshift faster than the cavity modes. Therefore, when working on the higher frequency side of the gain maximum the carrier density should increase in order to keep the gain equal to the losses. To explain type II PS occurring on the higher frequency side of the gain maximum, two conditions should be met: (1) the linearly polarized mode with higher frequency has to show the larger gain (solid line in FIGS. 9(a)) and (2) the two gain curves should move apart from each other with increasing current (FIG. 9(b)). In such a case the initial gain of the lower frequency mode is larger (FIG. 9(a)). But, when the two gains move apart as the current is increased, they become equal (FIG. 9(b)) and, eventually, the higher frequency mode will have the larger gain (FIG. 9(c)). It should be mentioned that in this picture type II PS could be preceded by type I PS around the gain maximum. Such double PS has been experimentally demonstrated and described in B. Ryvkin et al., J. Opt. Soc. Am. B 16, p. 2106, 1999. If, instead of condition (1), the lower frequency mode has the larger gain, PS would not happen on the higher frequency side of the gain maximum. If, instead of condition (2), the two gain curves move closer to each other with the current, type I PS could still occur on the higher frequency side of the gain maximum. The pronounced asymmetry in the polarization behavior is attributed for the cases A and B to the interplay between the residual strain which is oriented about 20° away from the [110] direction (FIGS. 6(a) and 7(a) and the applied strain).

The "two-gain" curve mechanism can provide a natural explanation of the tuning of the PS current with the externally induced anisotropic strain (tensile strain along [1–10], case A). As the strain is increased, not only the frequencies of the two modes but also the two gain curves move apart. Moreover, the gain maxima are also shifted. As a result, the PS current could decrease with increasing strain.

Figure 10:
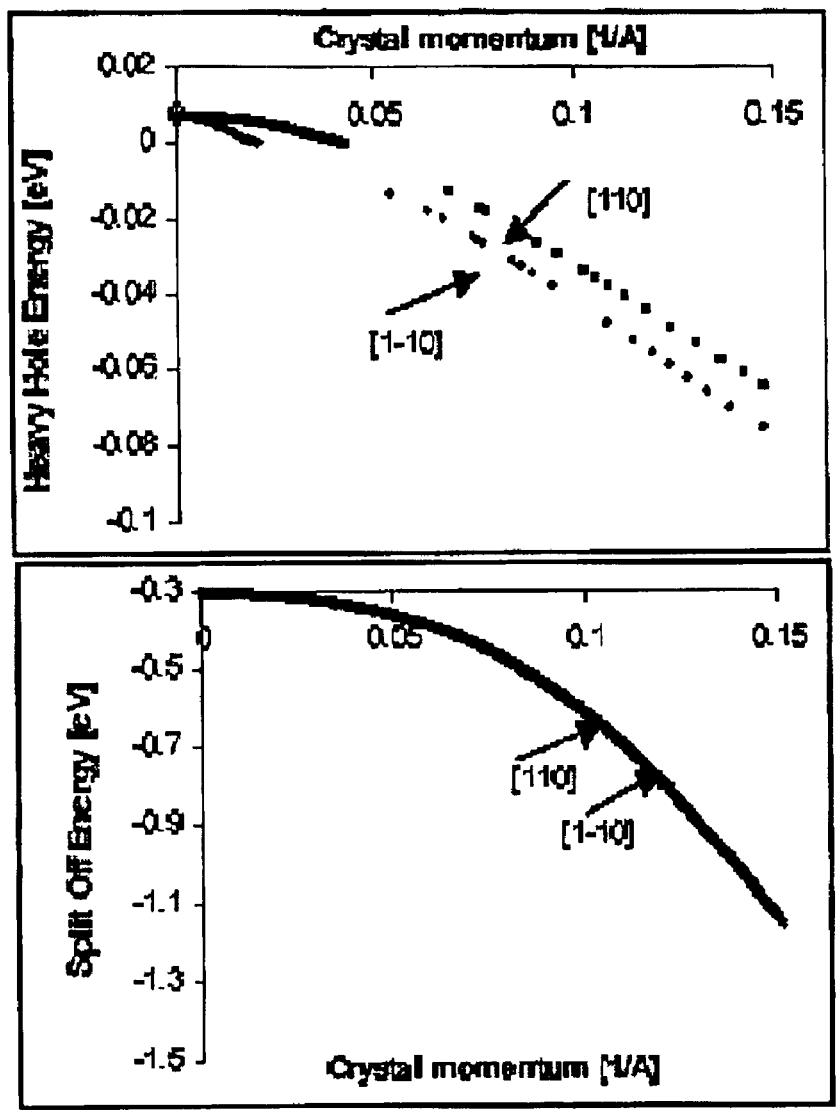
FIG. 10 illustrates the calculated HH and SO band energies as a function of the in-plane crystal momentum for tensile strain along [110] crystallographic direction.

In practice, one has to consider not only the influence of the anisotropic strain on the material gain, but also similar modification of the material losses. The absorption is mainly due to the inter-valence band transitions in the highly p-doped distributed Bragg mirror of the VCSEL. To demonstrate the effect of the in-plane anisotropic strain on the absorption the Luttinger—Kohn Hamiltonian is considered for the HH, LH and SO (split-off) bands and the strain contribution is introduced again according to the Bir-Pikus theory. The thus calculated HH and SO band energies as a function of the in-plane crystal momentum are shown in FIG. 10 for tensile strain along [110] crystallographic direction. The two curves (as denoted in the figure) represent the case for in-plane crystal momentum along [110] and [1–10] crystallographic direction. The anisotropy of the HH and SO bands, where the responsible for the absorption optical transitions take place, is clearly seen from this figure.

The overlap of the optical field and the carrier density radial distributions, i.e. the modal gain, should also be introduced for correct treatment. The modal becomes current dependent due to a change in the optical field pattern (by thermal lensing, as described in K. Panajotov et al., "Polarization switching in VCSELs due to thermal lensing", IEEE Phot. Techn. Lett., vol.10, pp.6–8, 1998) or in the carrier distribution (by spatial hole burning, as described in A. Valle et al., "Polarization behavior of birefringent multitransverse mode Vertical-Cavity Surface Emitting Lasers", IEEE Phot. Techn. Lett., v.9, pp.557–559, 1997).

Finally, the situation when the laser would continuously be working on the lower frequency side of the gain maximum is briefly considered. Then the two-gain-curve mechanism predicts PS only if the lower frequency mode has the larger gain. If the gain of the lower frequency mode changes faster than the gain of the higher frequency mode, type I PS should occur. In the opposite case type II PS will occur.

The experiments reveal that an externally induced in-plane anisotropic strain leads both to birefringence (via the elasto-optic effect) and to in-plane gain anisotropy. Consequently, a separate gain curve for each of the two polarization modes has to be considered. Such a point of view can qualitatively explain the experimentally observed type II PS appearing on the higher frequency side of the gain maximum, as well as double PS (type I followed by type II). It has been shown that VCSELs emit linearly polarized light: two fundamental modes with orthogonal linear polarizations are supported by the cavity. When increasing the injection current PS occurs from the mode with lower frequency to the mode with higher frequency. The orientation of the two orthogonal linearly polarized eigenmodes strongly depends on the internal and the externally induced in-plane anisotropic strain. Such anisotropic strain strongly modifies the polarization behavior of VCSELs making it possible to tune of the current at which polarization switching happens in the entire region of lasing in the fundamental mode.

In the above experiments, the force applied to strain the VCSEL is a force that is high enough to bend the package. The polarization orientation can be tuned by changing the amount of stress applied. This ability to vary the strain at will and reversibly is difficult or impossible to obtain with prior art methods, especially if the manufacturing process of the VCSEL has to be changed to change the degree of strain. Hence, the present invention provides a novel way of setting a uniaxial strain in a VCSEL, which can be adjusted or tuned to a final desired performance and polarization stability.

The concept described above, however, can have the disadvantage that, it does not always have long-term stability. If the force applied to the package decays, for example due to aging or creep, or if the mechanical fixing moves for one reason or another, it is possible that the polarization direction of the emitted light is no longer fixed to the wanted polarization direction, as the strain in the packaging substrate and the strain in the VCSEL are directly related to each other (high stress on the package causes high strain in the packaging substrate, which in turn causes high strain on the VCSEL). This is a disadvantage, as downstream optical systems using the polarized light are set-up so as to have parameters dependent upon this polarization, e.g. minimum reflection at that polarization.

Therefore, it is preferred to have a solution in which the strain, once introduced, stable at the same level over time. This is obtained in accordance with embodiments of the present invention by applying strain to the mounting substrate by means of an additional substrate such as a packaging substrate. Preferably, the strain in the packaging substrate in the rest position is very low, and at the same time a strain in the VCSEL which is high enough to lock the polarization. If the strain in the packaging substrate is low, the effect of creep and aging is likely to be small so that the strain in the VCSEL remains constant. In order to achieve this, the packaging substrate should dominate the mounting substrate and/or VCSEL mechanically, e.g. the VCSEL assembly (VCSEL and mounting substrate) and the packaging substrate can have a big difference in their moments of inertia, so that the package is in an almost stress-free situation when the VCSEL assembly is strained.

According to a second embodiment of the present invention, strain is introduced into the VCSEL by a method comprising the steps of:

flexing the packaging substrate 40 as shown in FIG. 3A fixing the VCSEL 42 with a mounting substrate 44 on the flexed packaging substrate 40, e.g. by means of a cold set epoxy adhesive releasing the packaging substrate 40, as shown in FIG. 3B.

Fixing a stress-free mounting substrate 44 with VCSEL 42 on the flexed packaging substrate 40 and releasing the flexing of the packaging substrate 40 thereafter, introduces strain into the VCSEL 42. If the initial flexing of the packaging substrate 40 was high enough, the strain introduced in the VCSEL 42 is high enough to lock the polarization direction. The upper surface of the packaging substrate may be made convex or concave before the flexing step.

The strain introduced in the VCSEL 42 can be either tensile or compressive strain, depending on whether the packaging substrate 40 has been bent upwardly or downwardly respectively.

Instead of flexing the packaging substrate, the mounting substrate can be compressed in one direction by exerting a lateral external force e.g. by means of springs located between the sides of a hole in the packaging substrate and the mounting substrate located in the hole.

The mechanical properties of the packaging substrate with regard to the mechanical properties of the mounting substrate in combination with the VCSEL must be in such a ratio that the mechanical properties of the packaging substrate dominate, for example the ratio of the moment of inertia of the packaging substrate with regard to the moment of inertia of the combination of the mounting substrate and the VCSEL should be preferably at least 3 to 1, more preferably at least 5 to 1. Said in other words: a combination of a mounting substrate with a VCSEL is fixed to something mechanically much stronger. This means that relaxation of stresses in the packaging substrate will not have a large effect on the strain in the VCSEL. Furthermore, the application of the unixaxial strain can be made relatively independent of temperature as the strain is not induced by differences in thermal expansion coefficients.

According to a third embodiment of the present invention, strain is introduced into the VCSEL by uniaxial compression. A method for doing this may comprise the following steps, as shown in FIG. 4:

providing a hole 46 in a packaging substrate 40 that is in one direction slightly smaller than the mounting substrate 44 of the VCSEL 42 of which the polarization direction is to be stabilized, see FIG. 4A, heating the packaging substrate 40 so as to enable it to expand, introducing the mounting substrate 44 with VCSEL 42 fixed thereon in the hole 46 in the packaging substrate 40, see FIG. 4B, cooling down the packaging substrate 40 so that it shrinks back to its original dimensions again, and that way it compresses the mounting substrate 44 in one direction and it introduces strain in the VCSEL 42 in one direction.

The strain thus introduced into the VCSEL 42 locks the polarization direction of the light generated by the VCSEL 42.

The compressive force deliverable by the packaging substrate must be large. Therefore, the Young's modulus of the packaging substrate should be ideally larger than that of the mounting substrate, e.g. at least three times larger than the Young's modulus of the mounting substrate, preferably five times larger, or still larger. (The larger the Young's modulus for a material, the larger the force necessary to obtain a change in dimension of that material.) In that case, if relaxation of stress inside the mounting substrate takes place, the change in strain is very small. Careful selection of the material for the mounting substrate to which the VCSEL is transferred after cleaving and of the packaging substrate can provide this difference in Young's modulus.

According to a fourth embodiment of the present invention, strain is again introduced into the VCSEL by a sideways compression in one direction, this time by bending a packaging substrate, which has a predetermined hole in it. The final device is then less sensitive to temperature changes than the one of the previous embodiment. A method for doing this may comprise the following steps, as shown in FIG. 5:

providing a hole 46 in a packaging substrate 40 that is in one direction slightly smaller than the mounting substrate 44 of the VCSEL 42 of which the polarization direction is to be stabilized, see FIG. 5A, bending the packaging substrate 40 so that the gap 46 opens up wider and introducing the mounting substrate 44 with VCSEL 42 fixed thereon in the hole 46 in the packaging substrate 40, see FIG. 5B, releasing the packaging substrate 40 so that it clamps the mounting substrate 44 in one direction and introduces strain in the VCSEL 42 in one direction.

The strain thus introduced into the VCSEL 42 locks the polarization direction of the light generated by the VCSEL 42.

According to a fifth embodiment, an intermediate substrate under tensile or compressive in-plane stress is used between an unmodified mounting substrate and an unmodified package substrate. The intermediate substrate may be put under stress according to any or the previous embodiments.

For the above embodiments, it is necessary that the packaging substrate or the intermediate substrate is stiff so that it exerts a large force onto the mounting substrate when recovered to its original condition, i.e. flat and/or with its original dimensions. The packaging substrate or intermediate substrate must be mechanically so dominant that the strain imparted on the mounting substrate and the VCSEL remains constant over a long period of time, despite possible relaxations of stresses over time.

If a VCSEL exhibits a polarization switching at a certain injection current, it can be deduced from tests how much stress needs to be applied to the mounting surface in order to obtain a polarization which is locked at a certain direction.

By then first measuring the polarization of the light emitted by an unstrained VCSEL, it can be selected how much strain is needed to be introduced into the VCSEL by one of the embodiments given above, i.e. for example how much the packaging substrate needs to be flexed (embodiments 1 and 2), how much the hole in the packaging substrate must be smaller than the mounting substrate (embodiments 3 and 4), or how much in-plane stress must be provided in the intermediate substrate (embodiment 5).

Alternatively, an unpackaged mounting substrate with a VCSEL mounted thereon, can be flexed, and it can be detected which polarization of light comes out, or without flexing the unpackaged mounting substrate, it can be detected which polarization splitting is obtained. On the basis of the result a certain bending of a packaging or intermediate substrate or a certain dimension of hole in the packaging or intermediate substrate can be selected.

In a further embodiment of the present invention the uniaxial strain may be induced in a dynamic manner, e.g. by means of a piezoelectric force actuator attached to the bottom of the mounting substrate. By this means the performance of the device may be tuned by altering the degree of strain induced by the piezoelectric device. In order to fine tune a device, a piezoelectric force actuator may be attached to the packaging substrate, the VCSEL or the mounting substrate in accordance with any of the previous embodiments of the present invention. Then, when the piezoelectric actuator is at rest, the strain in the VCSEL is determined by the strain induced by the packaging substrate. However, this strain can be fine tuned by actuation of the piezoelectric force actuator.

For this purpose, one or more piezo-ceramic transducers or any other high precision mechanical transducers that can be electrically controlled may be incorporated in the VCSEL package. This can be done in different ways all of which are embodiments of the present invention.

Figure 11:
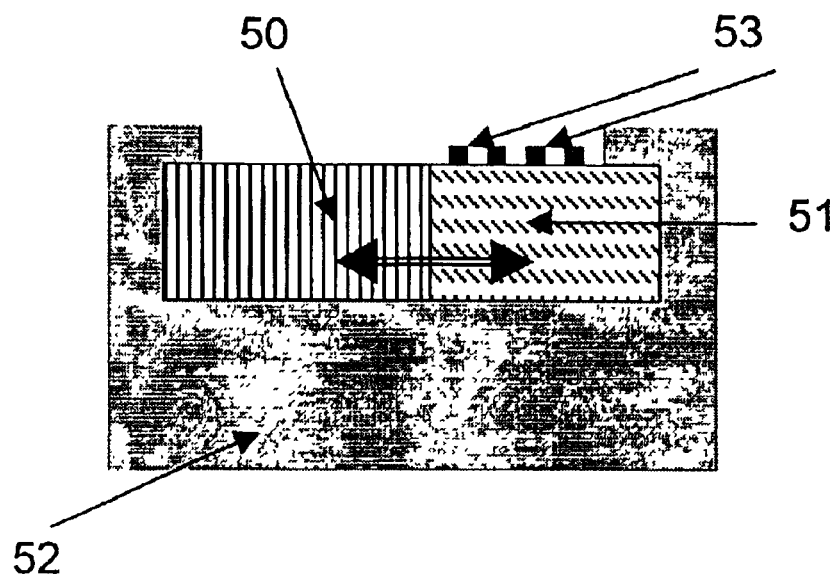
FIG. 11 illustrates a first embodiment of a device for active control of polarization stability and active tuning of the polarization switching current in VCSELs, wherein a piezo-electric transducer is attached to a VCSEL wafer.
Figure 12:
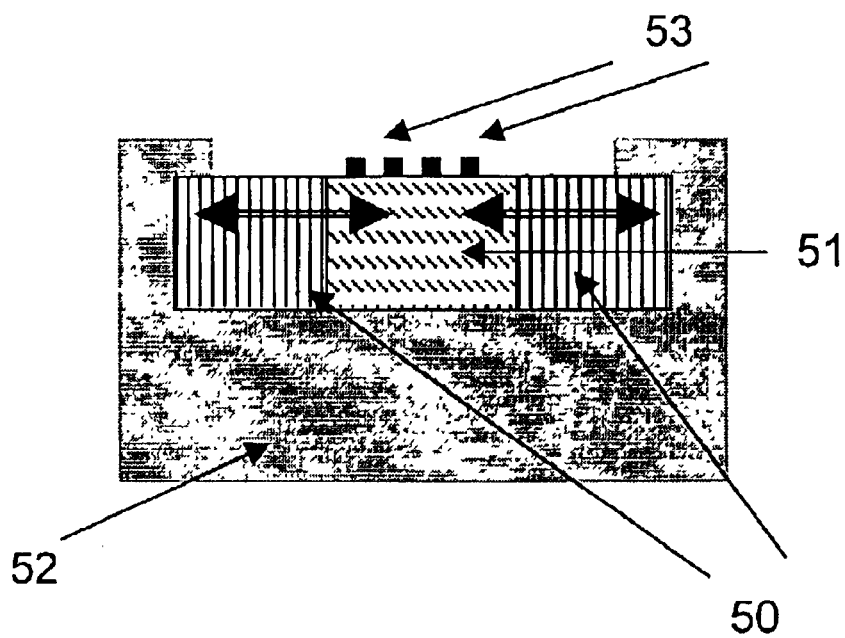
FIG. 12 illustrates a second embodiment of a device for active control of polarization stability and active tuning of the polarization switching current in VCSELs, wherein a VCSEL wafer is sandwiched between two piezo-electric transducers.

As a first example, a laterally coupled high precision mechanical transducer such as a piezo-transducer 50 and a semiconductor wafer 51 provided with one or more VCSELs 53 are considered, as shown in FIG. 11. The piezo-ceramic transducer 50, already fixed at one wall of the package 52 pulls or presses (as represented by the double arrow in FIG. 11) the VCSELs wafer 51, already fixed to the opposite wall of the package 52. Alternatively, two piezo-ceramic transducers 50 may be fixed at two opposite walls of the package 52 and the VCSELs wafer 51 with one or more VCSELs 53 may be situated between them and be laterally fixed to them. This is shown in FIG. 12.

Due to the fact that the piezo-transducers 50 and the VCSEL wafer 51 are fixed together, the elongation or the contraction of each of the piezo-elements 50, induced by a voltage applied to it, causes pulling or pressing (as represented by the double arrows in FIG. 11 and FIG. 12) of the VCSEL wafer 51. In such a way tensile, respectively compressive strain is induced in the plane of the VCSEL multilayer structure in an electrically controllable way.

As a second example, bending of the semiconductor wafer 51 electrically controlled by high precision mechanical transducers such as piezo-ceramic transducers 50 is considered. The principle of operation of such an approach is illustrated in FIG. 13 and FIG. 14.

Figure 13:
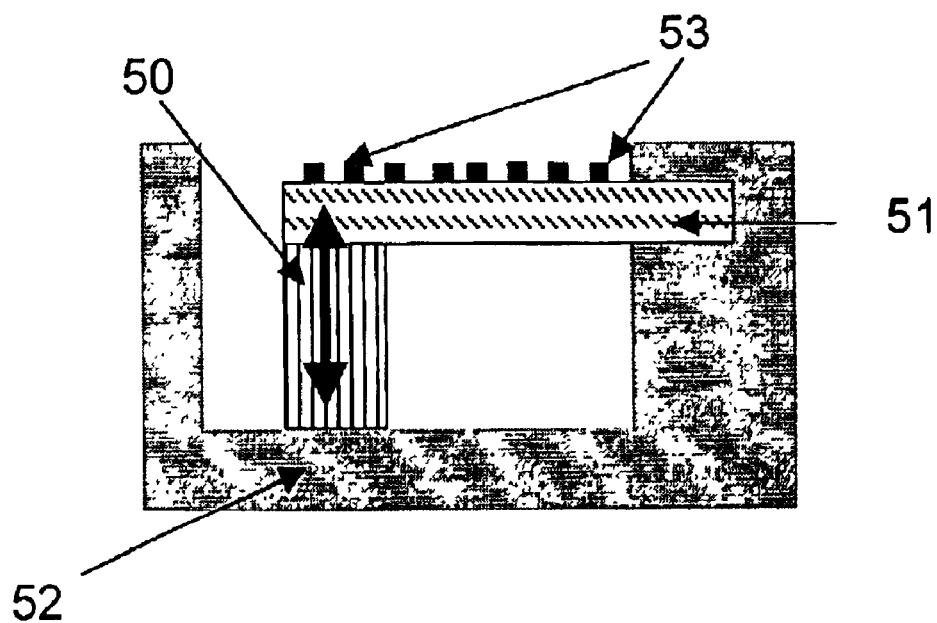
FIG. 13 illustrates a third embodiment of a device for active control of polarization stability and active tuning of the polarization switching current in VCSELs, wherein a VCSEL wafer is longitudinally fixed with one extremity to the VCSEL package, and is transversally attached to the VCSEL package by means of a piezo-electric transducer.

In FIG. 13, one side of a VCSEL wafer 51 is fixed in longitudinal direction to a wall of the laser package 52 and the other side is fixed in transversal direction to a high precision mechanical transducer such as a piezo-ceramic transducer 50. Bending of the laser wafer 51 is caused by contraction or elongation (as represented by the double arrow in FIG. 13) of the piezo-ceramic transducer 50. Tensile, respectively compressive, strain in the plane of the multilayer VCSEL structure is created by such outward, respectively inward, bending of the semiconductor wafer 51 when voltage is applied to the piezo-ceramic transducer 50.

Figure 14:
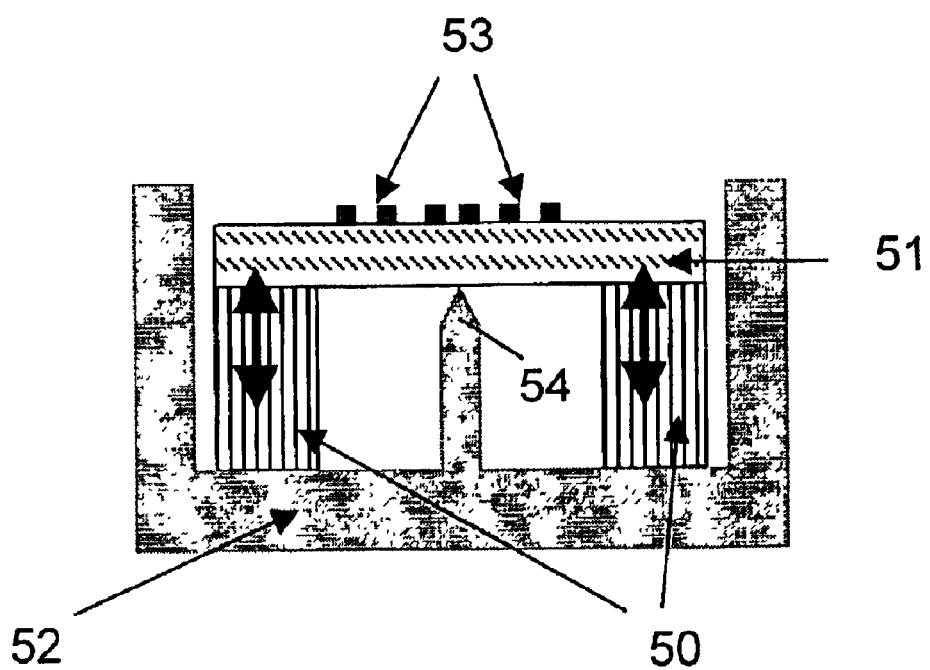
FIG. 14 illustrates a fourth embodiment of a device for active control of polarization stability and active tuning of the polarization switching current in VCSELs, implementing bending of a VCSEL wafer by means of two piezo-electric transducers attached to the extremities of the VCSEL wafer, the VCSEL wafer being positioned between its extremities onto a sharp edge of the VCSEL package.

In FIG. 14 two extremities of the VCSEL wafer 51 are fixed transversally to two high precision mechanical transducers such as piezo-ceramic transducers 50. A sharp edge 54 in the package 52 touches the semiconductor wafer 51 between its two edges in longitudinal direction, for example substantially in the middle. In this case, the bending of the laser wafer 51 is caused symmetrically by the contraction or the elongation (as represented by the double arrow in FIG. 14) of the two piezo-ceramic transducers 50. Again, this outward respectively inward bending of the semiconductor wafer 51 causes tensile respectively compressive strain in the plane of the multilayer VCSEL structure when a voltage is applied to the piezo-ceramic transducer 50.

Figure 15:
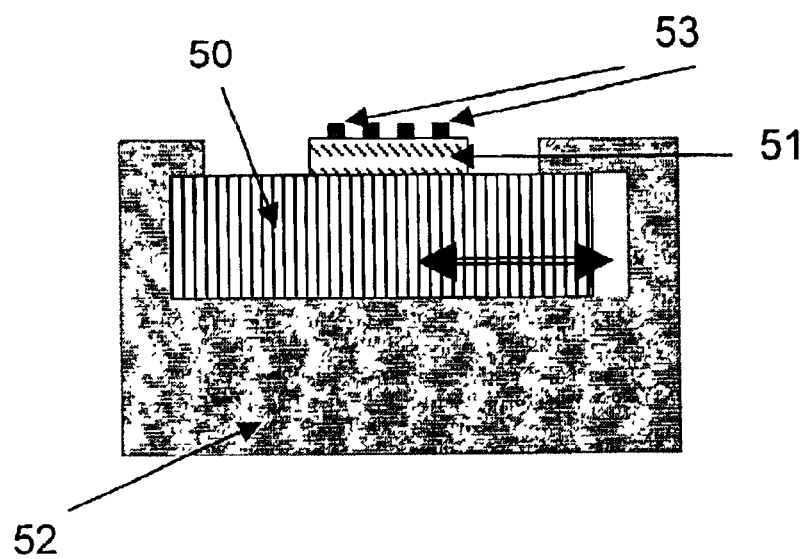
FIG. 15 illustrates a fifth embodiment of a device for active control of polarization stability and active tuning of the polarization switching current in VCSELs, wherein a VCSEL wafer is attached longitudinally onto a piezo-electric transducer.

As a third example, a transversally fixed high precision mechanical transducer such as a piezo-transducer 50 and semiconductor wafer 51 are considered. The drawing illustrating the principle behind this embodiment is given in FIG. 15. Strain is transferred to the VCSEL wafer 51 when the piezo-ceramic transducer 52 contracts or expands (as illustrated by the double arrow in FIG. 15) by the electrical voltage applied to it.

As another control of the polarization properties of VCSELs, including fine tuning of the current at which a sharp polarization switching occurs, two ways of introducing strain in the whole VCSEL package are suggested. External stress is applied on the VCSELs 53 using laser holders as schematically shown and explained hereinabove with regard to FIG. 2 and in FIG. 16.

Figure 16:
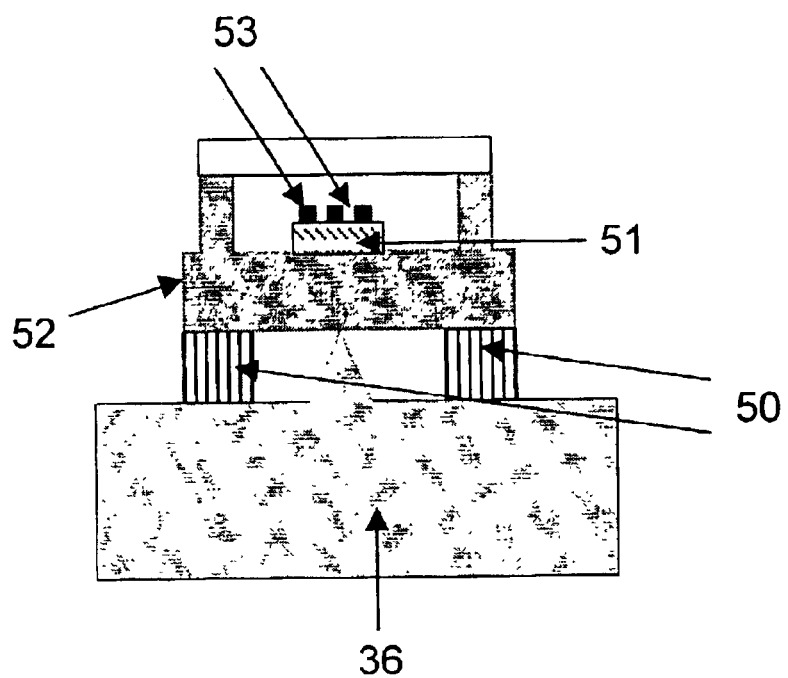
FIG. 16 illustrates a second embodiment of a device for active control of polarization stability and active tuning of the polarization switching current in VCSELs, wherein a metal plate of a VCSEL package is bent by means of two piezo-electric transducers.

In FIG. 16, the same principle as in FIG. 2 is applied with two high precision mechanical transducers such as piezoelectric transducers 50 that are diametrically fixed to the VCSEL package 52. Instead of a steel rod 35, a sharp edge 56 may be provided between the metal plate 37 of the VCSEL package 52 and the VCSEL holder plate 36. Now, the bending of the metal plate 37 of the package 52, and consequently of the laser wafer or VCSEL wafer 51, is fine tuned in an electrical way, by changing the voltage applied to the transducers 50.

A feedback mechanism may be provided which allows the polarization direction of the VCSEL is be adjusted, altered or tuned according to the present invention. The polarization of the light emitted by the VCSEL is detected by a detector and compared with a desired polarization direction. Depending on the result of the comparison, the polarization direction of the VCSEL may be altered more or less, e.g. by changing the strain using a piezoelectric force actuator.

The embodiments given above can provide a low-cost solution: the VCSEL chip is simply packaged into a package while providing enough strain in one direction. No complex (and thus expensive) processing changes are necessary.

It is possible to cleave a die with VCSELs first and put each separate VCSEL on a strained package substrate or intermediate substrate. Alternatively it is possible to fix a whole array of VCSELs on a strained substrate and cleave them afterwards to obtain separate VCSELS with a fixed polarization direction.

Although there has been constant improvement, change and evolution of devices in this field, the present concepts are believed to represent substantial new and novel improvements, including departures from prior practices, resulting in the provision of more efficient, stable and reliable devices of this nature.

While the invention has been shown and described with reference to preferred embodiments, it will be understood by those skilled in the art that various changes or modifications in form and detail may be made without departing from the scope and spirit of this invention.

What is claimed is the following:

1. Method for stabilizing the polarization of light generated by a VCSEL assembly comprising a light generation region of a VCSEL, the VCSEL being mechanically coupled to a mounting substrate, the method comprising the steps of:

mechanically coupling the mounting substrate to a second substrate which is coextensive or larger in area than the mounting substrate, and applying uniaxial strain to the light generation region of the VCSEL by means of external strain applied to the mounting substrate by the second substrate or by means attached to the second substrate.

2. Method according to claim 1, wherein the step of applying strain comprises applying strain to the second substrate by a means external to the second substrate and the VCSEL assembly.

3. Method according to claim 1, wherein the step of applying strain comprises applying strain by means of a mechanical transducer.

4. Method according to claim 1, comprising the steps of inducing strain in the mounting substrate by flexing the second substrate before applying the VCSEL and mounting substrate to the second substrate, and thereafter releasing the second substrate.

5. Method according to claim 4, wherein the applying step comprises attaching the mounting substrate to a major surface of the second substrate.

6. Method according to claim 4, further comprising the step of forming a hole in the second substrate with dimensions larger than the dimensions of the mounting substrate in one direction and smaller than the mounting substrate in another direction, and wherein the applying step comprises flexing the second substrate such as to open the hole, placing the mounting substrate in the hole and releasing the second substrate to thereby apply compressive strain to the mounting substrate.

7. Method according to claim 1, comprising the steps of making a hole in the second substrate with dimensions larger than the dimensions of the mounting substrate in one direction and smaller than the mounting substrate in another direction, after the hole-making step, heating the second substrate so as to enable it to expand, after the heating step, introducing the VCSEL on the mounting substrate into the hole, then cooling down the second substrate so as to compress the mounting substrate in one direction.

8. Method according to claim 1, wherein the second substrate is a packaging substrate.

9. Method according to claim 1, wherein the second substrate is an intermediate substrate to be mounted between the mounting substrate and a packaging substrate.

10. Method according to claim 1, wherein the stress exerted by the second substrate on the mounting substrate induces an average strain in the second substrate which is at least three times lower than the average strain induced in the mounting substrate.

11. A VCSEL device having a stabilized polarization of light generated by a VCSEL assembly comprising:

a light generation region of a VCSEL, the VCSEL being mechanically coupled to a mounting substrate, a second substrate being coextensive or larger in area than the mounting substrate in at least one direction, the mounting substrate being mechanically coupled to the second substrate, and means for applying strain to the light generation region of the VCSEL by means of external strain applied to the mounting substrate by the second substrate or by means attached to the second substrate.

12. VCSEL device according to claim 11, said means for applying strain to the second substrate being external to the second substrate and the VCSEL assembly.

13. VCSEL device according to claim 11, wherein said means for applying strain are at least one mechanical transducer.

14. VCSEL device according to claim 11, wherein the second substrate is flexed before applying the VCSEL and mounting substrate to the second substrate, and thereafter the second substrate is released thereby inducing strain in the mounting substrate.

15. VCSEL device according to claim 14, wherein the mounting substrate is attached to a major surface of the second substrate.

16. VCSEL device according to claim 14, further comprising: a hole in the second substrate with dimensions larger than the dimensions of the mounting substrate in one direction and smaller than the mounting substrate in another direction, and the mounting substrate is located in the hole such that compressive strain is applied to the mounting substrate.

17. VCSEL device according to claim 11, wherein the second substrate is a packaging substrate.

18. VCSEL device according to claim 11, wherein the second substrate is an intermediate substrate mounted between the mounting substrate and a packaging substrate.

* * * * *